United States Patent
Franaszek et al.

(10) Patent No.: US 7,962,700 B2
(45) Date of Patent: Jun. 14, 2011

(54) SYSTEMS AND METHODS FOR REDUCING LATENCY FOR ACCESSING COMPRESSED MEMORY USING STRATIFIED COMPRESSED MEMORY ARCHITECTURES AND ORGANIZATION

(75) Inventors: Peter Anthony Franaszek, Mount Kisco, NY (US); Luis Alfonso Lastras-Montano, Cortlandt Manor, NY (US); Robert Brett Tremaine, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 937 days.

(21) Appl. No.: 11/516,188

(22) Filed: Sep. 6, 2006

(65) Prior Publication Data
US 2008/0055323 A1    Mar. 6, 2008

(51) Int. Cl.
G06F 13/12 (2006.01)
G06F 12/00 (2006.01)
G06F 9/26 (2006.01)
G06F 11/00 (2006.01)
G09G 5/00 (2006.01)

(52) U.S. Cl. .......... 711/153; 710/68; 711/118; 711/129; 711/173; 711/202; 711/205; 711/206; 711/207; 714/6; 714/7; 345/555

(58) Field of Classification Search .................. 711/153, 711/154, 170, 173, 118, 129, 202, 205, 206, 711/207; 710/68; 714/48, 6, 7; 345/555
See application file for complete search history.

(56) References Cited

U.S. PATENT DOCUMENTS

| | | | | |
|---|---|---|---|---|
| 5,812,817 A | * | 9/1998 | Hovis et al. | 711/173 |
| 5,856,975 A | * | 1/1999 | Rostoker et al. | 370/395.64 |
| 6,263,413 B1 | * | 7/2001 | Motomura et al. | 711/173 |
| 6,324,621 B2 | * | 11/2001 | Singh et al. | 711/129 |
| 6,401,181 B1 | | 6/2002 | Franaszek et al. | 711/170 |
| 6,446,145 B1 | * | 9/2002 | Har et al. | 710/68 |
| 6,795,897 B2 | * | 9/2004 | Benveniste et al. | 711/118 |
| 7,039,769 B2 | | 5/2006 | Castelli et al. | 711/147 |
| 7,340,666 B1 | * | 3/2008 | Wright et al. | 714/774 |
| 7,512,750 B2 | * | 3/2009 | Newburn et al. | 711/154 |

(Continued)

FOREIGN PATENT DOCUMENTS

| | | | | |
|---|---|---|---|---|
| JP | 02000066844 A | * | 3/2000 | |
| JP | 2002132546 A | * | 5/2002 | |

OTHER PUBLICATIONS

P.A. Franaszek et al. *Algorithms and Data Structures for Compressed-Memory Machines*, IBM J. Res. & Dev., vol. 45, No. 2, Mar. 2001, pp. 245-258.

*Primary Examiner* — Kevin L Ellis
*Assistant Examiner* — Mehdi Namazi
(74) *Attorney, Agent, or Firm* — F. Chau & Associates, LLC; Stephen C. Kaufman, Esq.

(57) ABSTRACT

Compressed memory systems are provided to reduce latency associated with accessing compressed memory using stratified compressed memory architectures and memory organization protocols in which a region of compressed main memory is allocated as a direct access memory (DAM) region for storing uncompressed data items. The uncompressed data items in the DAM region can be directly accessed, speculatively, to serve access requests to main memory, requiring access to compressed memory in the event of a DAM miss.

28 Claims, 9 Drawing Sheets

U.S. PATENT DOCUMENTS

| | | | |
|---|---|---|---|
| 7,587,572 B1* | 9/2009 | Stenstrom | 711/173 |
| 2003/0217237 A1* | 11/2003 | Benveniste et al. | 711/153 |
| 2004/0117578 A1* | 6/2004 | Castelli et al. | 711/170 |
| 2004/0230767 A1* | 11/2004 | Bland et al. | 711/203 |
| 2005/0108483 A1* | 5/2005 | Bungo | 711/156 |
| 2006/0184745 A1* | 8/2006 | Tan | 711/143 |
| 2008/0059728 A1* | 3/2008 | Daly et al. | 711/158 |

* cited by examiner

SYSTEMS AND METHODS FOR REDUCING LATENCY FOR ACCESSING COMPRESSED MEMORY USING STRATIFIED COMPRESSED MEMORY ARCHITECTURES AND ORGANIZATION

This invention was made with Government support under contract numbers NBCHC020056 and NBCH3039004 awarded by Defense Advanced Research Projects Agency (DARPA). The Government has certain rights to this invention.

TECHNICAL FIELD OF THE INVENTION

The present invention relates generally computer memory management systems and methods for reducing the latency associated with access to compressed main memory and, in particular, systems and methods for allocating a region of compressed main memory for storing uncompressed data, which can be directly accessed, speculatively, to serve data requests to main memory and minimize latency associated with compression/decompression on accesses to compressed main memory.

BACKGROUND

In general, main memory typically represents a significant portion of the costs associated with computer systems. To reduce such costs, various memory system frameworks have been proposed in which data compression is employed to store all or a portion of the contents of main memory in compressed form, so as to effectively yield an increase in memory storage without actually increasing the size of memory. These memory systems are generally referred to herein as "compressed memory systems."

Compressed memory systems may include a main memory that stores compressed data and a cache memory, for example, to store uncompressed data, where data requests are served by fetching requested data from the cache memory. A "hit" refers to a circumstance in which the requested data is accessed from uncompressed data in the cache memory, On the other hand, a "miss" refers to a circumstance in which the requested data is not stored in the cache, thereby requiring the requested data to be fetched from compressed data stored in the main memory.

A common problem with compressed memory systems is the performance latency associated with accessing compressed data. For example, in the event of a "miss", the requested data must be fetched from the compressed data in the main memory, decompressed, and then stored in uncompressed form in the cache memory. One way of reducing this performance penalty is to implement a large cache memory that can store a large amount of uncompressed data lines separate from main memory. This method, although effective, is limited by practical reasons due to the high costs associated with large cache memory. In other conventional compressed memory systems, a portion of main memory is allocated as a cache memory region, where some subset of data lines are stored uncompressed in the allocated cache memory region. A limiting factor with this conventional technique is that a relatively large cache directory, which is needed to access and manage uncompressed data items stored in the cache memory, must be held on a processor chip or some other chip outside of main memory.

Another common problem with compressed memory systems is performance latency associated with "reorganization work" that is needed for data accesses to compressed memory. Reorganization work refers to the series of operations of moving data to and from the compressed and uncompressed memory regions, which must be performed after data accesses to compressed memory. For example, in the event of a "miss" as discussed above, the requested data must be fetched from compressed memory, decompressed, and then stored in the uncompressed memory region. In the event that data items in the compressed memory and the uncompressed memory are mutually exclusive, then certain data in the uncompressed memory region must also be fetched from the uncompressed memory region, compressed, and then stored in the compressed area. These reorganization processes are generally needed to maintain high hit rates in the main memory area. Reorganization work is generally undesirable because it utilizes memory resources and can delay completion of other memory operations.

SUMMARY OF THE INVENTION

Exemplary embodiments of the invention generally include computer memory management systems and methods for reducing the latency associated with access to compressed main memory. In one exemplary embodiment, a computer system includes a main memory having a non-direct access memory (NDAM) region and a direct-access memory (DAM) region, and a memory controller to manage the main memory and control access to stored data items in the main memory. In one exemplary embodiment, the DAM region stores uncompressed data and at least a portion of the NDAM region stores compressed data.

In response to a memory access request, the memory controller will access the DAM region, speculatively, to determine if a requested data item is stored in the DAM region, and fetch the requested data item from the DAM region to serve said memory access request if said requested data item is stored in the DAM region. On the other hand, the memory controller will fetch the requested data item from data stored in the NDAM region, if the requested data item is not stored in the DAM region.

In one exemplary embodiment, the memory controller performs a speculative access to the DAM region using a hash function to translate a real address of the requested data item to a mapped address location (MAL) in the DAM region. The memory controller then examines tag data associated with a stored data item at the MAL to determine if the stored data item is the requested data item.

In yet another exemplary embodiment of the invention, the memory controller performs a speculative access to the DAM region using a hash function to translate a real address of the requested data item to a mapped address location (MAL) in the DAM region, and then compares stored ECC (error correction code) bits associated with a stored data item at the MAL with computed ECC bits that are computed using the stored data item concatenated with tag bits associated with the requested data item, to determine if the stored data item is the requested data item.

In another exemplary embodiment of the invention, the memory controller implements methods to dynamically vary the size of the DAM region in accordance with at least one memory performance parameter. For example, the memory performance parameter can be based on a percentage of cache misses that are served by access to the DAM region. With this features, the DAM region can be made to grow or shrink as a function of the current system working set size.

In other exemplary embodiments of the invention, a data item in the main memory is stored only in the DAM region or the NDAM region at any given time, or a data item in the main memory can be stored in the DAM region and in the NDAM region at a given time.

In yet another exemplary embodiment of the invention, the system further includes a cache memory and a cache directory. The cache directory maintains a DAM residence bit for each cached data item to indicate whether a corresponding cached data item is stored in the DAM region. This feature allows cache write-backs to the MAL of a cached line in the DAM region without having to first read the contents of the MAL of the cached line in the DAM region.

In other exemplary embodiments of the invention, uncompressed data items in the DAM region can be associated with flag bits which provide information related to frequency of access to the data items, which is used to determine a desired compression status of said data items. Further, compressed data items in the NDAM region can be associated with flag bits which provide information used to determine a desired compression status of the compressed data items.

These and other exemplary embodiments, aspects, features, and advantages of the present invention will become apparent from the following detailed description of the preferred embodiments, which is to be read in connection with the accompanying drawings.

DETAILED DESCRIPTION OF EXEMPLARY EMBODIMENTS

In general, exemplary embodiments of the invention as described hereafter in further detail include compressed memory systems and memory management protocols that are designed to optimize performance and hide latency associated with data accesses to compressed main memory. For example, exemplary embodiments of the invention include compressed memory systems having main memory that stores compressed data items wherein a region of main memory is allocated as a direct access memory (DAM) region for storing uncompressed data items. The uncompressed data items in the DAM region are directly accessed, speculatively, to serve access requests to main memory and minimize latency associated with compression and decompression on accesses to compressed main memory. In other exemplary embodiments of the invention, memory management systems and methods are provided which implement data block buffering and priority scheduling protocols that enable reorganization work for previous data access operations to be delayed and temporarily suspended so as to allocate resources needed for serving subsequent memory access requests, thereby masking the data access latency associated with memory reorganization work following access to compressed main memory.

It is to be understood that the systems and methods described herein may be implemented in various forms of hardware, software, firmware, special purpose processors, or a combination thereof. In particular, at least a portion of the present invention is preferably implemented as an application comprising program instructions that are tangibly embodied on one or more program storage devices (e.g., hard disk, magnetic floppy disk, RAM, ROM, CD ROM, etc.) and executable by any device or machine comprising suitable architecture, such as a general purpose digital computer having a processor, memory, and input/output interfaces. It is to be further understood that, because some of the constituent system components and process steps depicted in the accompanying Figures are preferably implemented in software, the connections between system modules (or the logic flow of method steps) may differ depending upon the manner in which the present invention is programmed. Given the teachings herein, one of ordinary skill in the related art will be able to contemplate these and similar implementations of the present invention.

Figure 1:
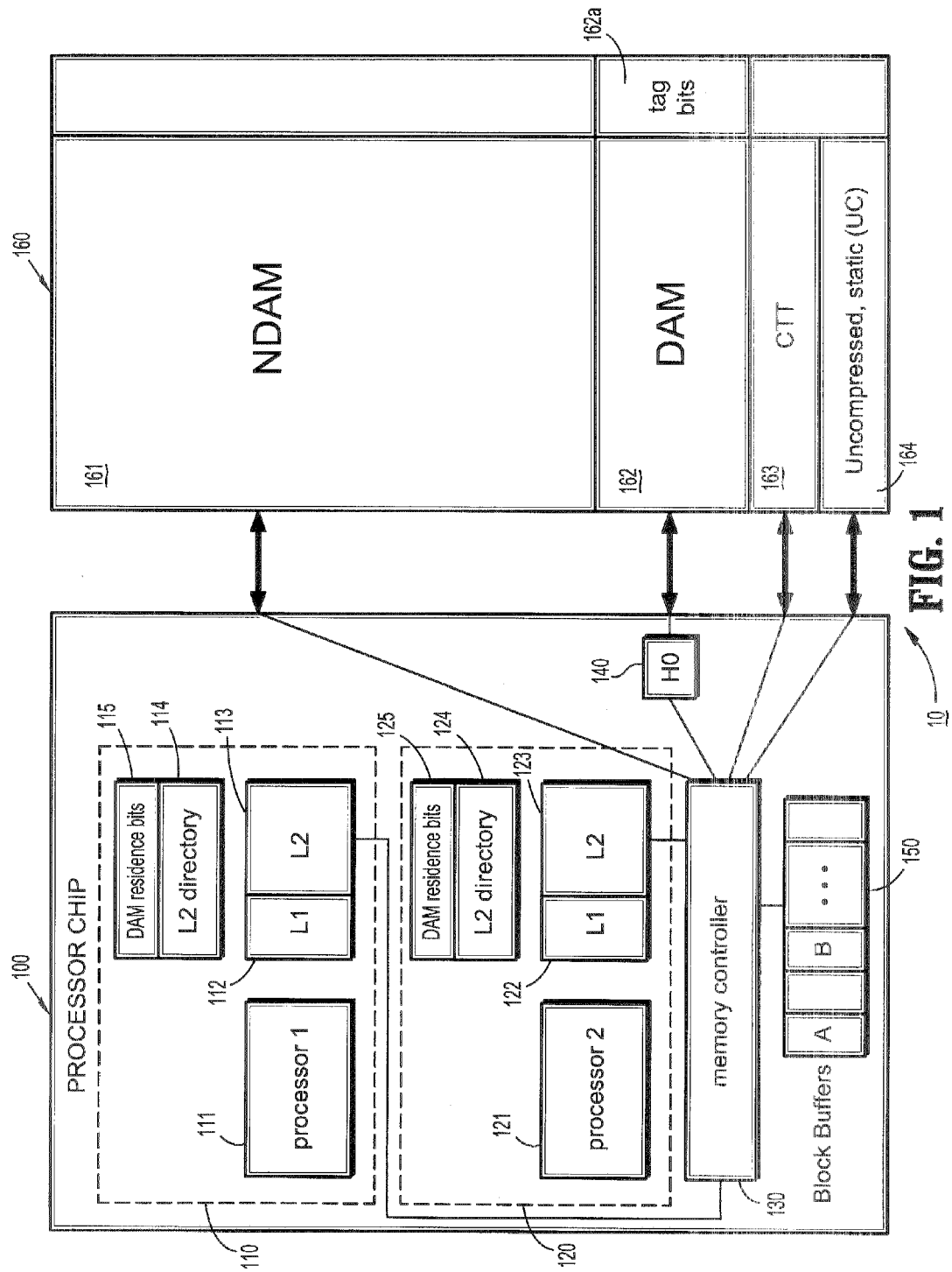
FIG. 1 is a high-level schematic illustration of a compressed memory system according to an exemplary embodiment of the invention.

FIG. 1 is a high-level schematic illustration of a compressed memory system (10) according to an exemplary embodiment of the invention. In general, the system (10) comprises a processor chip (110) and main memory (160). The processor chip (110) is a dual-core processor chip which generally comprises a first processor system core (110), a second processor system core (120), a memory controller (130), a hash function computation module (140), and a plurality of data block buffers (150). The first processor system core (110) comprises a processor (111) and associated L1 and L2 caches (112) and (113), and an L2 directory (114) with DAM (direct access memory) residence bits (115). Similarly, the second processor system core (120) comprises a processor (121) and associated L1 and L2 caches (122) and (123) and an L2 directory (124) with DAM residence bits (125).

The main memory (160) has an exemplary framework in which fixed-size blocks of data can be stored in uncompressed or compressed form. More specifically, in the exemplary embodiment of FIG. 1, the main memory (160) is logically partitioned into a plurality of regions, including, for example, an NDAM (non direct-access memory) region (161), a DAM (direct-access memory) region (162), a CTT (compression translation table) region (163), and a UC (uncompressed) region (164). The NDAM (161) is an area of main memory (160) which generally stores memory lines in compressed form, although it may also contain memory lines in uncompressed form. The DAM (162) is an area of main memory (160) which stores memory lines in uncompressed form along with associated tag bits (162a) (in particular, memory lines recently fetched from the NDAM (161) and uncompressed). The CTT (163) area stores compression translation table data entries that provide the physical location of compressed memory lines stored in the NDAM (161). The UC area (160) is a part of main memory that stores certain data that is not compressible or not intended to be compressed, such as operating system data, which is accessed using conventional methods. As discussed in detail below, methods are implemented for dynamically increasing and decreasing the size of the DAM (162) as a function of the size of the working set of the exemplary system. In this regard, the size of the NDAM (161) can be a substantial fraction of the size of the main memory (160), yet the DAM (162) is sufficiently large so that it can hold a working set of an application for a variety of processes In general, the system (10) has an exemplary framework in which the on-chip L1 caches (112), (122) and L2 caches (113), (123) store copies of most frequently accessed data from the main memory (160) for immediate access. The processors (111) and (112) read data from, and write data to, their respective L1 and L2 caches. For illustrative purposes, exemplary embodiments of the invention will be described where it is assumed that the L1/L2 caches are partitioned into 128 B lines. The L2 directories (114) and (124) store the "real address" of each L2 cache line. In the event of cache misses/write-backs, data must be read from/written to main memory (160). The L2 directories (114) and (124) include directory entries to provide on-chip directory access for cache lines of respective L2 caches (113) and (123). The directory entries in the L2 caches (113) and (123) are appended with corresponding residence bits (115) and (125) to indicate whether the given caches line is currently resident in the DAM (162), which advantageously allows a cached line to be written back to the DAM (162) without first retrieving the current occupant at the MAL of the line (as will be explained below in further detail).

The memory controller (130) implements various methods according to exemplary embodiments of the invention for controlling memory accesses to main memory (160) in response to cache line requests and for managing memory reorganization operations for the main memory (160). For instance, as explained below, the memory controller (130) includes a compression controller/engine for compressing uncompressed data to be stored in the NDAM region (161) and for decompressing compressed data that is accessed from the NDAM region (161). The memory controller (130) implements methods for performing real address-to-physical address translation using the data directory stored in the CTT region (163) and the hash function computation module (140) to access compressed and uncompressed data blocks in the NDAM (161) and DAM (162) regions of memory (161), respectively. The real addresses are abstract addresses that are used by the processors (111) and (112) to access memory in the main memory (160). The physical addresses are used by the memory controller (130) to address physical locations in the NDAM (161) and DAM (162).

Moreover, as explained in further detail below, the memory controller (130) utilizes block buffers (150) for storing, and rapid access of, one or more compressed and/or uncompressed data blocks for pending memory reorganization operations pursuant to priority scheduling protocols. The data block buffers (150) together with priority scheduling protocols allow memory reorganization work for one or more previous accesses to compressed memory to be prioritized, temporarily halted and delayed so as to allocate the necessary resources to serve new access requests or other priority commands.

The real memory visible to the processors (111) and (121) is divided into fixed-sized memory lines each consisting of 128 B. To ensure adequate compressibility, these lines are grouped in pairwise disjoint sets each consisting of four contiguous memory lines. Each set is referred to as a data block. Similarly, the physical memory assigned to the DAM (162) is grouped in data blocks each of size 512 B. The physical memory assigned to the NDAM (161) is organized in fixed size individual memory lines (also called sectors) that generally store compressed data.

The memory controller (130) performs real-to-physical address translation by a lookup in directory of CTT entries in the CTT region (163), which is kept at a reserved location in the physical memory (160). The memory controller (130) can locate a compressed data block in the NDAM (161) by fetching a corresponding CTT entry for the requested block, where the CTT entry provides the physical location or sectors in the NDAM (161) holding the requested compressed data block. A simple hash of the real address can be used to generate an index to a corresponding entry in the CTT directory, as is well-known in the art. In one exemplary embodiment of the invention, compressed memory lines can be stored in variable length formats such that a compressed data block can be stored in one to four of the 128 B sectors depending on its compressibility. The physical sectors containing a compressed memory line do not have to be contiguous physical addresses, and can be located anywhere within the NDAM (161) region of main memory (160). The compressed blocks can be placed in sectors, with possible sharing of sectors among blocks with contiguous real addresses (roommating). Moreover, the CTT entries have control bits (flags) that indicate, for example, whether the line is stored in compressed format or uncompressed format, whether the line is highly compressible and is stored entirely in the CTT directory entry, how many sectors the line occupies, and a flag containing the fragment information (e.g., what portion of the last used sector is occupied by the line) which is used for roommating.

The DAM region (162) of main memory (160) stores the most recent uncompressed memory lines (accessed from the NDAM (161) and decompressed) along with identifying tags (tags bits 162a). In one exemplary embodiment, the uncompressed data blocks (memory lines) are stored in the DAM (162) in blocks of 512 B. To minimize the performance penalty (reduce the latency) associated with compression/decompression for data accesses to the NDAM (161), the memory controller (130) uses the DAM (162) to serve cache line requests with reduced access time. The memory controller (130) employs memory access protocols which allow uncompressed lines in the DAM (162) to be directly accessed, speculatively, without the need for separate directories (i.e., similar to a direct-mapped cache with cache lines stored along with their identifying tags). On a DAM miss, the memory controller (130) will access the NDAM (161) to fetch and decompress the requested block.

The DAM (162) is essentially a region of the main memory (160) that stores uncompressed memory lines for the purpose of reducing access time to main memory (160), but does not operate as a cache in the traditional sense—each line held in the DAM (162) does not have a counterpart (i.e., a line with the same real or processor address) in other regions of the main memory (160)). As noted above, in one embodiment, data items in the DAM (162) are stored in blocks of 512 B, where each block comprises 4 contiguous cache lines of 128 B units. Assuming that any one of $2^R$ possible blocks can be stored in a given location in the DAM (162) (i.e., the location of a given block in the DAM (162) holds one of $2^R$ possible aliases), the identity of the actual block stored can be given by R bits (a tag) appended to each 128 B line, which in a preferred embodiment, are stored with the error control coding (ECC) bits associated with those lines. That is, if a block is in the DAM (162), the block is at a location in the DAM (162) as determined by its real address, and the block actually stored in such location is identified by R disambiguation bits or the tag bits (162a) stored with each line in the block. The DAM (162)

location for a line is referred to as the mapped address location (MAL). The MAL is obtained by the hash computation module (140) which applies a hash function H0 on the real address of the block.

It is to be understood that other methods may be employed for identifying stored data blocks other than use of stored tag bits. For instance, in some memory systems, there may be no unused bits (in addition to the ECC bits) available to store the tag bits in the DAM region (162). In one exemplary embodiment, error control codes used to protect cache lines, although capable of protecting longer messages, can be shortened so as to match the geometry of the memory subsystem. For example, Reed-Solomon codes with byte symbols have maximum codeword lengths of 255, but typically the codeword length used will be less than 100.

In this regard, the codeword lengths can be properly sized, such that ECC bits can be computed for a data word comprising a cache line concatenated with tag bits. In particular, when an uncompressed cache line is to be stored in the DAM, the memory controller (130) may concatenate the cache line with the tag bits of the cache line to be stored in the DAM (162) and then input the compound message to an ECC generation engine. The ECC generation engine will compute the ECC bits of the data word comprising the concatenated cache line and tag, but the only the cache line and computed ECC bits will be stored (i.e., the additional tag information is not stored in the memory, but only the cache line and ECC bits using the same number of data and redundant bits as before). Thereafter, when a cache line is speculatively retrieved from the DAM (162), the memory controller (130) can determine if the stored cache line is the requested cache line by concatenating the stored data line with a tag of the requested cache line and recomputing the ECC bits. The recomputed ECC bits are compared to the ECC bits of the stored cache line, which are read from memory. Assuming that there are no physical errors in the storage medium, any discrepancy between the recomputed ECC bits and the stored ECC bits will indicate that the stored data line retrieved from memory is not the requested cache line (the tag of the requested line does not match the tag of the retrieved line) If there were physical errors in the storage medium, then the procedure may result in an uncorrectable error, or may still succeed depending on the error correction capacity of the error control code. When there is an uncorrectable error, the system will generally halt.

Figure 2:
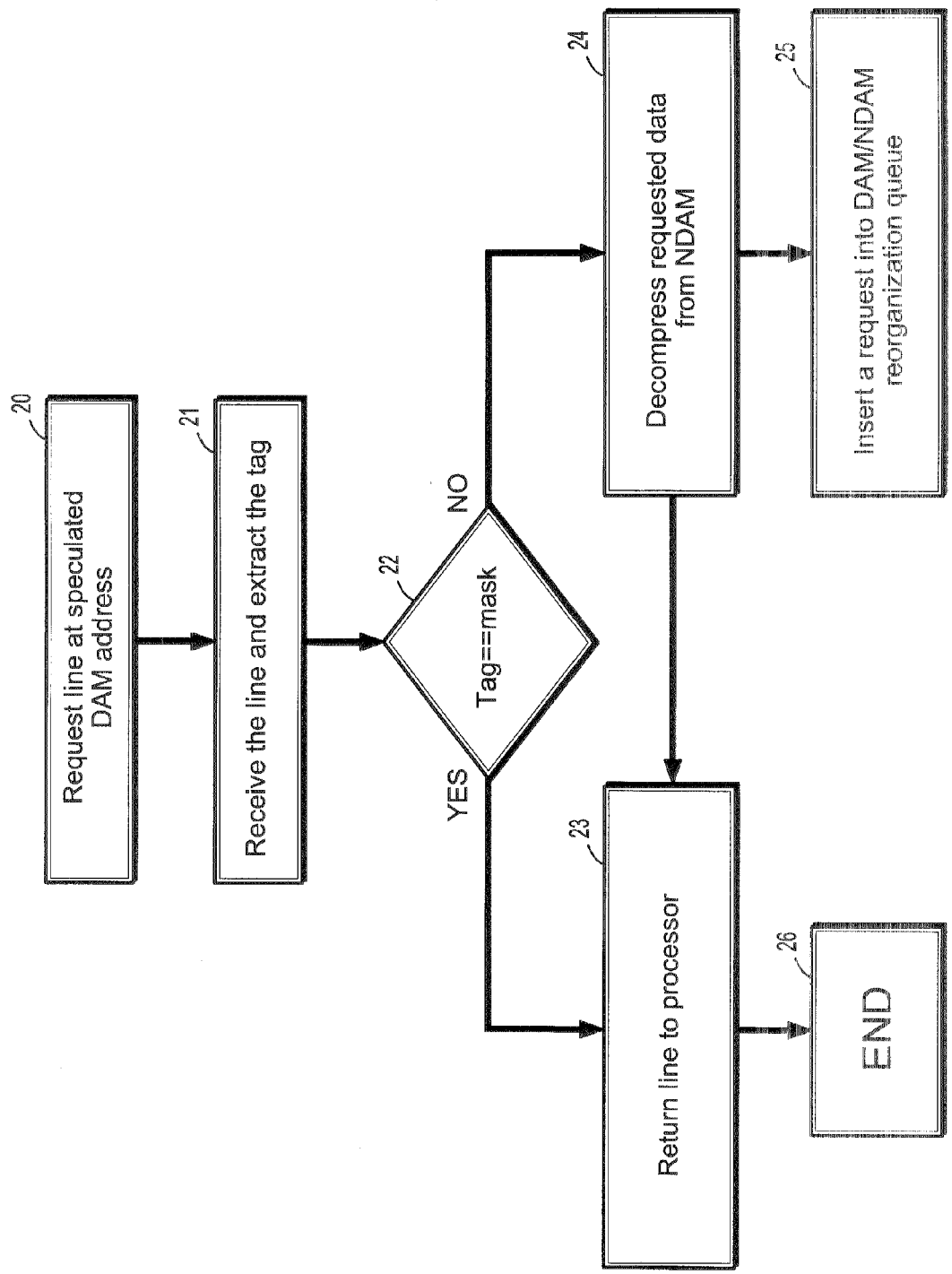
FIG. 2 is a high-level flow diagram illustrating a method for accessing main memory in a compressed memory system, according to an exemplary embodiment of the invention.

Exemplary steady state modes of operation of the compressed memory system (10) will now be discussed with reference to FIGS. 2~7, for example, which illustrates memory access and management methods that are designed to hide the latency associated with data accesses to the NDAM (161) region and following memory reorganization operations. For example, FIG. 2 is a high-level flow diagram illustrating a method for accessing the main memory (160) in the compressed memory system (10) of FIG. 1, according to an exemplary embodiment of the invention. When either processor (111) or (121) must read or write to a given memory location in main memory (160), the processor will first determine whether the memory location is in an associated cache (L1 or L2). If the processor determines that the given memory location is not in its associated L1 or L2 cache, the processor will forward a request to the memory controller (130) to fetch the desired cache line from main memory (160). In particular, as illustrated in FIG. 2, a speculative memory access is performed (step 20) by accessing the DAM (162) to fetch a line stored in a speculated DAM (162) mapped address location (MAL) where the requested line may be stored in uncompressed form along with associated identity bits (e.g., tag bits or ECC bits). For example, the memory controller (130) will fetch the line currently occupying the MAL for the requested line by translating the "real address" supplied by the processor into a physical address where the requested line may be stored in the DAM (162). For some uncompressed data items, the address translation is performed by the hash computation module (140) using a hash function, without use of the stored data. With this method, as noted above, the location (physical address) that is obtained may actually be occupied by any one of a plurality of "aliases" of the requested line.

In this regard, once the physical address for the DAM access is determined, the memory controller (130) will fetch the line and associated tag bits, for example, currently occupying the physical address (step 20), and then examine the tag bits to determine whether the occupying line is actually the requested line (step 21). If the occupying line is the requested line (affirmative determination in step 22), the occupying line is returned to the requesting processor and inserted into an associated cache (step 23), wherein the memory access operation terminates (step 26).

On the other hand, if it is determined that the occupying line is not the requested line (negative determination in step 22), the memory controller (130) will proceed to access the requested line from the NDAM (161). In particular, the memory controller (130) will use the real address to access the associated CTT entry in the CTT region (163), which allows the memory controller (130) to determine the compressed data block in the NDAM (161) holding the requested cache line. The memory controller (130) will fetch the compressed data block, and the data block will be decompressed to obtain the requested cache line (step 24). The requested cache line is then returned to the processor (step 23), and then placed in the processor cache(s) after a cache line residing in the cache is evicted (via an operation described below).

In addition, a reorganization request is issued and placed in a DAM/NDAM reorganization queue (step 25) pending initiation of reorganization work that may be needed following the data access operations discussed with reference to FIG. 2. For example, when it is determined that the occupying line is not the requested line (step 22), the data block currently residing in the MAL (mapped address location) (the DAM location) for the requested line should be fetched from the DAM (162), updated for any changes, compressed, and then stored in the NDAM (161), and the relevant CTT entry is updated in CTT (163) memory. Moreover, reorganization work is performed to store the uncompressed data block in the DAM (162) following retrieval and decompression of such block from the NDAM (161) (in step 24).

Figure 3:
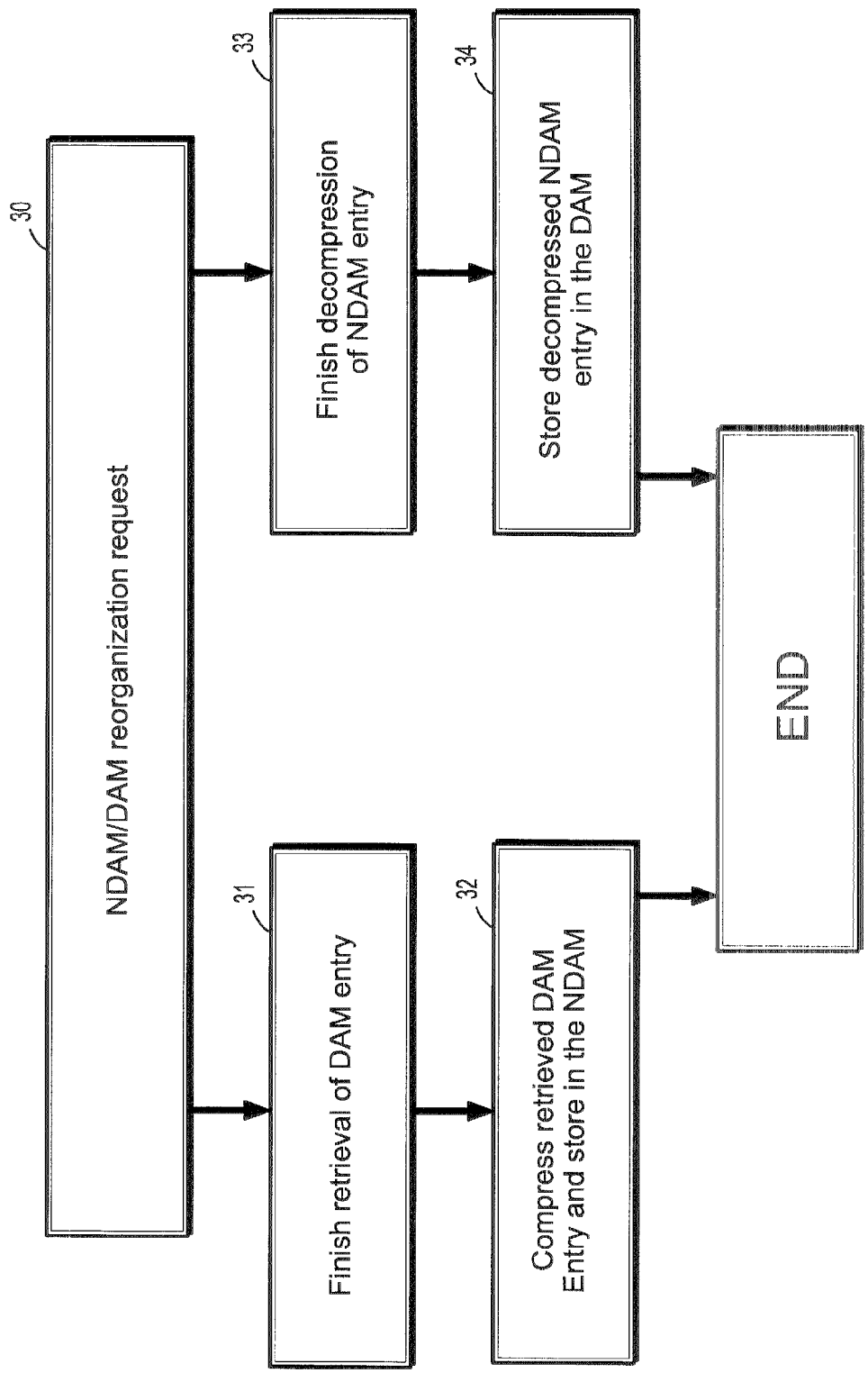
FIG. 3 is a flow diagram illustrating a method for performing memory reorganization according to an exemplary embodiment of the invention.

FIG. 3 is a flow diagram illustrating a method for performing memory reorganization according to an exemplary embodiment of the invention. In particular, FIG. 3 illustrates memory reorganization methods that may be performed after processing a pending memory reorganization request (step 30) issued and queued (in step 25, FIG. 2) when a requested cache line is accessed from compressed data in the NDAM (161). In one exemplary embodiment of the invention, when it was determined that the occupying line was not the requested line, the memory reorganization process includes an operation whereby the speculated DAM access operation (in step 21, FIG. 2) is continued to fetch the entire line for the DAM entry (step 31). Once completed, the DAM entry is then updated for any changes, compressed, and stored in the NDAM (step 32).

Furthermore, the exemplary memory reorganization process includes an operation whereby the decompression process is continued to finish decompressing the compressed data block retrieved from the NDAM entry (step 24, FIG. 2) if, for example, the decompression process was halted after finding the requested line to return to the processor (step 23, FIG. 2) prior to completion of the decompression process. Once the decompression process (step 33) is complete, the decompressed data block is updated for any changes, and stored in the DAM (step 34), and the CTT entry of the data block is updated and stored in CTT memory (163).

Figure 4:
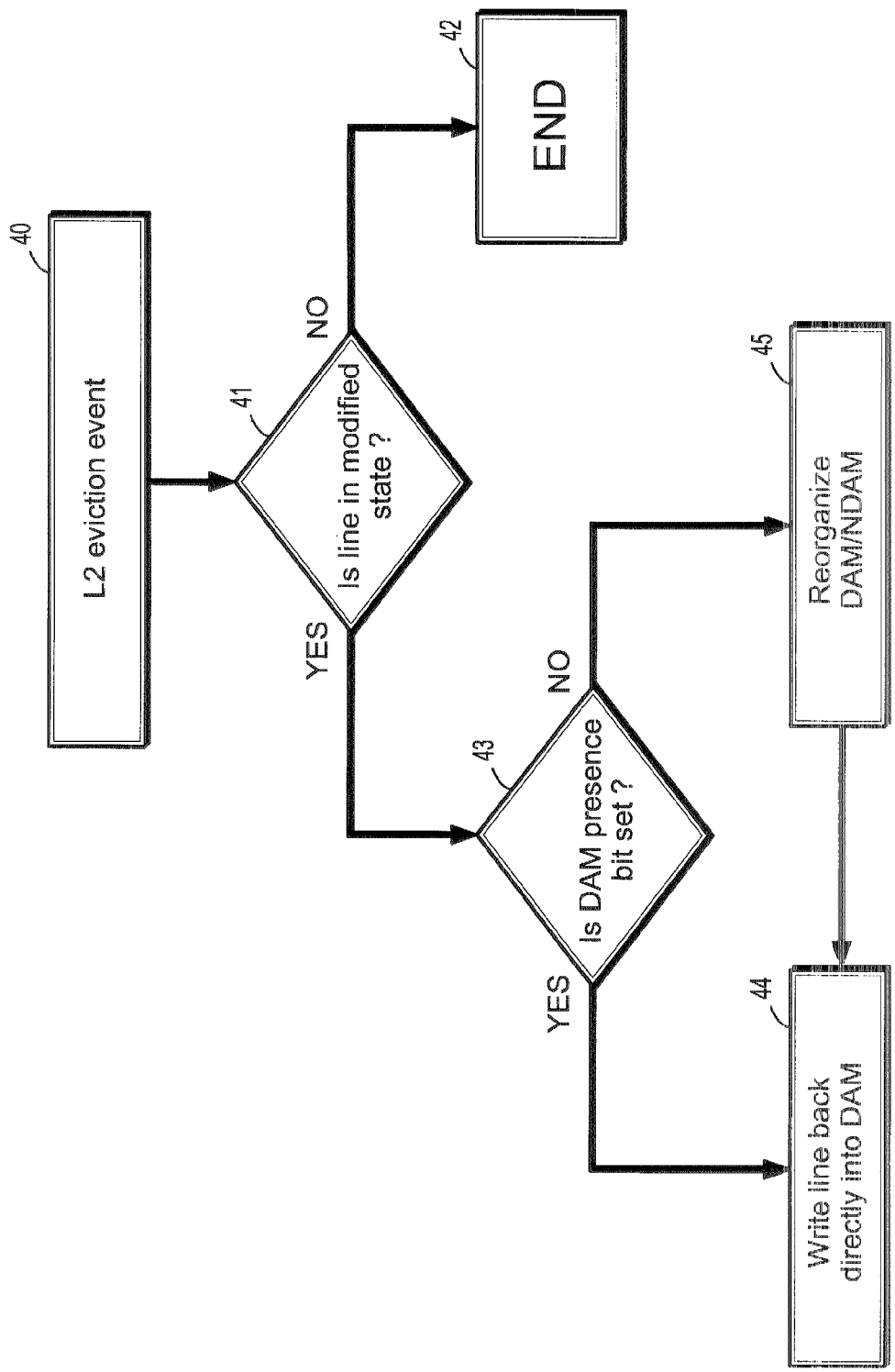
FIG. 4 is a flow diagram illustrating a method for performing a cache eviction method according to an exemplary embodiment of the invention.

As noted above, when a requested line is accessed from memory and returned to the requesting processor (step 23, FIG. 2), the returned line will be stored in the processor cache(s) after a line residing in the cache is discarded (evict existing entry to make room for new entry). FIG. 4 is a flow diagram illustrating a method for performing a cache eviction method according to an exemplary embodiment of the invention. In response to a cache eviction event (step 40), a determination is made as to whether the line has been modified (step 41). If it is determined that the line has not been changed (negative determination in step 41), the line is discarded and no further action is taken (step 42).

If, on the other hand, the line has been changed (i.e. the dirty bit is set to 1) (affirmative determination in step 41), the line must be written out. If the DAM residence bit of the line is set to "1" (affirmative determination in step 43), then the line is written directly back to its MAL (location in DAM) (step 44). As previously stated, the residence bit indicates whether or not the given cache line is resident in the DAM (162). If the line is resident in the DAM (162), the data can be written directly to the DAM (162) on an L2 eviction.

On the other hand, if the DAM residence bit of the line is not set to "1" (negative determination in step 43), the line must be read from the DAM (162) before writing back (step 44), and DAM/NDAM reorganization operations may be performed (step 45) using methods discussed, for example, with reference to FIG. 3). For example, the line currently residing in the MAL of the line is fetched from the DAM (162). If the identity of the fetched line is equal to that of the line to be discarded, the line is written to its MAL. If the identify of the line and the line currently residing at the MAL are not equal, the block holding the line to be discarded is fetched from the NDAM (161), decompressed, modified, and recompressed, and then written back to the DAM (162) (step 44) and its CTT entry is updated in the CTT memory (163).

The various steps described above with reference to FIGS. 2~4 include data access operations of the compressed memory system of FIG. 1 in the event of an L2 fault for a line not currently occupying the MAL, as well as additional steps for memory reorganization including, accessing, relocating, compressing, and decompressing blocks of data, as well as updating metadata for the data blocks. Various techniques and protocols can be implemented for controlling the memory reorganization operations in FIGS. 3-4 such that data blocks of previous memory access operations can be temporarily buffered to delay processing of such data blocks and thereby prioritize memory transactions and allocate resources for current data access requests. The memory reorganization operations can proceed when no other memory requests are available to process, and can be temporarily halted if a new memory request is received. By storing data in the block buffers (150), suspension can occur at any stage of the reorganization operations.

In general, a memory system comprising DAM and NDAM regions will implement operations to move data which is located in one (first) region into another (second) region, and reclaim the space occupied by the data in the first region, if necessary. This is true even when the NDAM region more generally holds data affected by some invertible transformation such as data encryption or joint compression and encryption, for example. By way of specific example, the NDAM region could be physically located in an unsafe portion of the memory system while the DAM region could be located in a safe portion of the memory system, where data is moved from the NDAM region into the DAM region and vice versa by performing decryption and encryption, respectively.

Advantageously, a memory system can implement block buffers and priority scheduling mechanisms according to exemplary embodiments of the invention, to support operations of swapping memory items stored in the DAM region and the NDAM region (with the necessary additional transformations), in a manner similar as described for the case when the invertible transformation includes lossless compression.

For example, in one embodiment where the invertible transformation includes encryption, if after a speculative fetch the system determines that the information retrieved is not the information requested, then the system accesses the CTT tables to obtain location information for the encrypted data. This data is read and stored in the block buffers (150) so that it can be decrypted thereafter, and written to the DAM region. For the encryption/decryption engine, the system may employ any suitable encryption algorithm known to those of ordinary skill in the art.

It is to be appreciated that exemplary embodiments of the invention as described herein for managing DAM and NDAM regions in the case of compressed memory systems can be readily employed, and readily translated into management policies, for encrypted memory systems. In this regard, the exemplary embodiments described herein for a particular embodiment of compressed memory systems should not be construed as limiting the scope of the invention.

Figure 7:
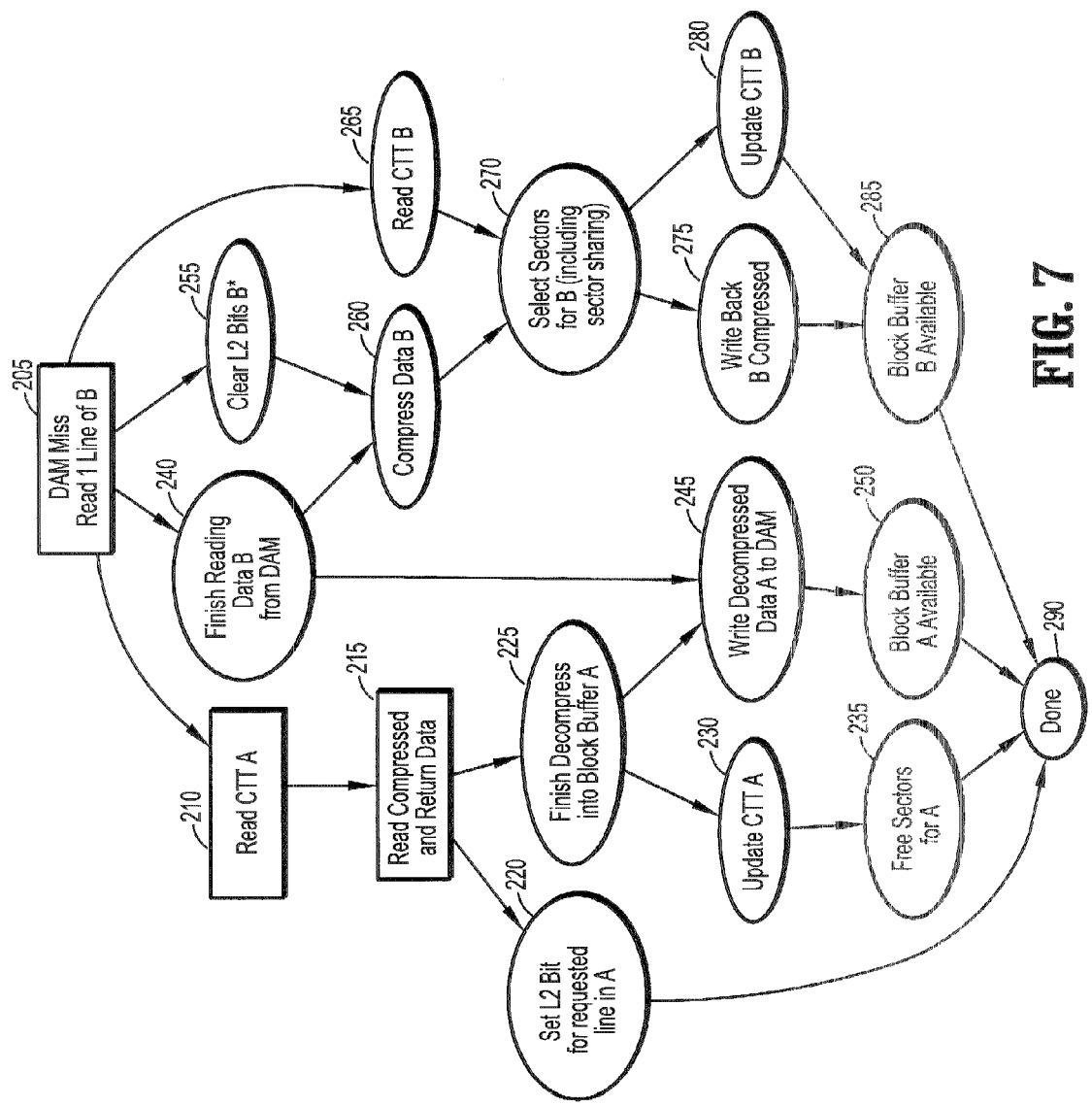
FIG. 7 is a flow diagram illustrating methods for priority scheduling of memory reorganization operations in a compressed memory system, according to exemplary embodiments of the invention.

FIG. 7 is a flow diagram illustrating memory reorganization operations for a compressed memory system, in accordance with an exemplary embodiment of the present invention. FIG. 7 illustrates various processing paths, where each path comprises a series of ordered/prioritized steps that are performed to complete reorganization work. For example, in FIG. 7, a downward arrow between one or more higher-positioned steps and a lower-positioned step indicates that the lower-positioned step is performed after completion of the one or more higher-positioned steps. Moreover, during memory reorganization work, the data being processed can be temporarily buffered at the completion of any of the process steps so that the reorganization work can be temporarily suspended, if necessary, to thereby allocate resources for subsequent memory access operations or higher priority memory management operations. It should be noted that the exemplary memory reorganization process in FIG. 7 is deemed completed when all process steps along all paths are completed.

For illustrative purposes, the reorganization operations of FIG. 7 will be discussed with reference to the compressed memory system of FIG. 1, and the memory reorganization steps discussed above with reference to FIGS. 2-4. FIG. 7 illustrates memory reorganization processing steps according to an exemplary embodiment of the invention, which are performed as a result of a data access to the NDAM (161) following an L2 cache miss and a DAM miss for a requested data line. In the following discussion, a block of compressed data that is accessed from the NDAM (161) is denoted "A" and a block of uncompressed data that is accessed from the DAM (162) to be compressed and relocated to the NDAM (161) is denoted as "B." Moreover, in FIG. 7, the rectangular shaped blocks (205, 210 and 215) depict three process steps that are initially performed before data is returned, while the remaining processing steps (oval-shaped blocks) can be processed in the background using the block buffers (150) (FIG. 1).

Referring now to FIG. 7, in the event that a speculative access for a requested data line results in a DAM miss (the uncompressed data line stored in the DAM is not a requested data line), the memory controller will read one line of the uncompressed data block "B" from the DAM (step 205). Thereafter, the memory controller will determine the location of a CTT entry of the compressed data block "A" for the requested data and then read the CTT entry (step 210). The memory controller will use the CTT entry to read sectors of the compressed data "A" from the NDAM (step 215). The compressed data lines are read from the NDAM, decompressed and stored in a data block buffer (e.g., block buffer A of FIG. 1). The reading and decompressing process (step 215) is temporarily halted once the requested line is returned. Since the decompressed data line is stored in the block buffer, the L2 residence bit can be set for the requested line in data block "A" (step 220).

In a next path (after step 215), the remaining sectors of the compressed data block "A" are read and decompressed and stored in the block buffer (step 225). The CTT entry for the compressed data block A is updated (step 230) to indicate that the compressed data block "A" is no longer located in the NDAM (162). The sectors in the NDAM (162) used to store the compressed data block "A" are freed (step 235). A sector can either be in use, storing compressed data, or can be free (available to be used). Free sectors can be used to store compressed data in the NDAM.

In another path (after step 205), the remainder of the uncompressed data block "B" is read (step 240) from the DAM (162) and stored in a block buffer (i.e., block buffer B of FIG. 1). Once the entire compressed data block "A" is decompressed and the entire uncompressed data block "B" has been read into the block buffer (i.e., after steps 240 and 225 are completed), the decompressed data block "A" is written to the DAM from the block buffer (step 245). The decompressed data block A is written to the MAL for "A.", where the MAL for "A" is also the MAL for "B". In other words, the decompressed data block A will be written to the exact location where the uncompressed data block "B" was stored (thus the need to move "B"). The CTT entry for the data block "A" will be updated to indicate that the block is stored in the DAM, but need not store the exact location. The block buffer allocated to store data block A becomes available for reuse (step 250). As an optimization, the decompressed data block "A" may be maintained in the block buffer A until the block buffer A is needed.

In another path (after step 205), the residence bits for any lines in the L2 cache that correspond to uncompressed data block "B" are cleared (step 255). After completion of steps 240 and 255, the uncompressed data block "B" stored in the block buffer can be compressed (step 260). In another path (after step 205), the location of the CTT entry for the uncompressed data block "B" is determined and read from memory (step 265).

After completion of steps 260 and 265, the memory controller will select sectors from a free sector list for storing the compressed data block "B" in the NDAM (step 270). The free sector list is a list (most likely in memory, but possibly in special purpose hardware), that stores all free sectors. When a sector is needed, a free sector is chosen (and removed) from the head of the free sector list. When a sector is freed, it is added to the free sector list. As noted above, different data blocks having the same CTT entry can share the same sector if there is unused storage space. In this regard, sector sharing can be achieved by finding unused space in sectors occupied by other data blocks sharing the CTT entry of the uncompressed data block B.

After step 270, the compressed data block "B" is written into the selected sectors of the NDAM (step 275). In another path (after step 270), the CTT entry for the compressed data block B is updated (step 280) to indicate the sectors storing or allocated to store the compressed data block "B." After completion of steps 275 and 280 (i.e., once the compressed data block "B" is written to the NDAM and the associated CTT entry is updated), the block buffer B becomes available to be reused (step 285). Again, as an optimization, the compressed data block "B" may be maintained in the block buffer until the block buffer is needed. After completion of steps 220, 235, 250 or 285, the memory reorganization work is complete (step 290).

It is to be understood that the process flow described above for FIG. 7 is merely an exemplary embodiment of priority scheduling for memory reorganization processes following a speculative DAM miss and that other priority scheduling protocols may be employed depending on the application. For example, one or more of the exemplary processing steps in FIG. 7 can be separated into smaller steps allowing reorganization work to be temporarily suspended between such steps. By way of specific example, the process of writing the decompressed data block "A" back to the DAM (step 245) can be divided into four separate write steps (assuming a data block consists of 4 cache lines), where each line could be written back as a separate steps, allowing delay/suspension between each line write operation.

In other exemplary embodiments of the invention, methods are provided for dynamically varying the size of the DAM (162) so that the DAM (162) can grow or shrink as a function of the set size of the exemplary system. As a result, the size of the NDAM (161) can be a substantial fraction of the size of the main memory (160), yet the DAM (162) is sufficiently large so that the DAM (162) can hold the working set of an application for a variety of applications.

Figure 5:
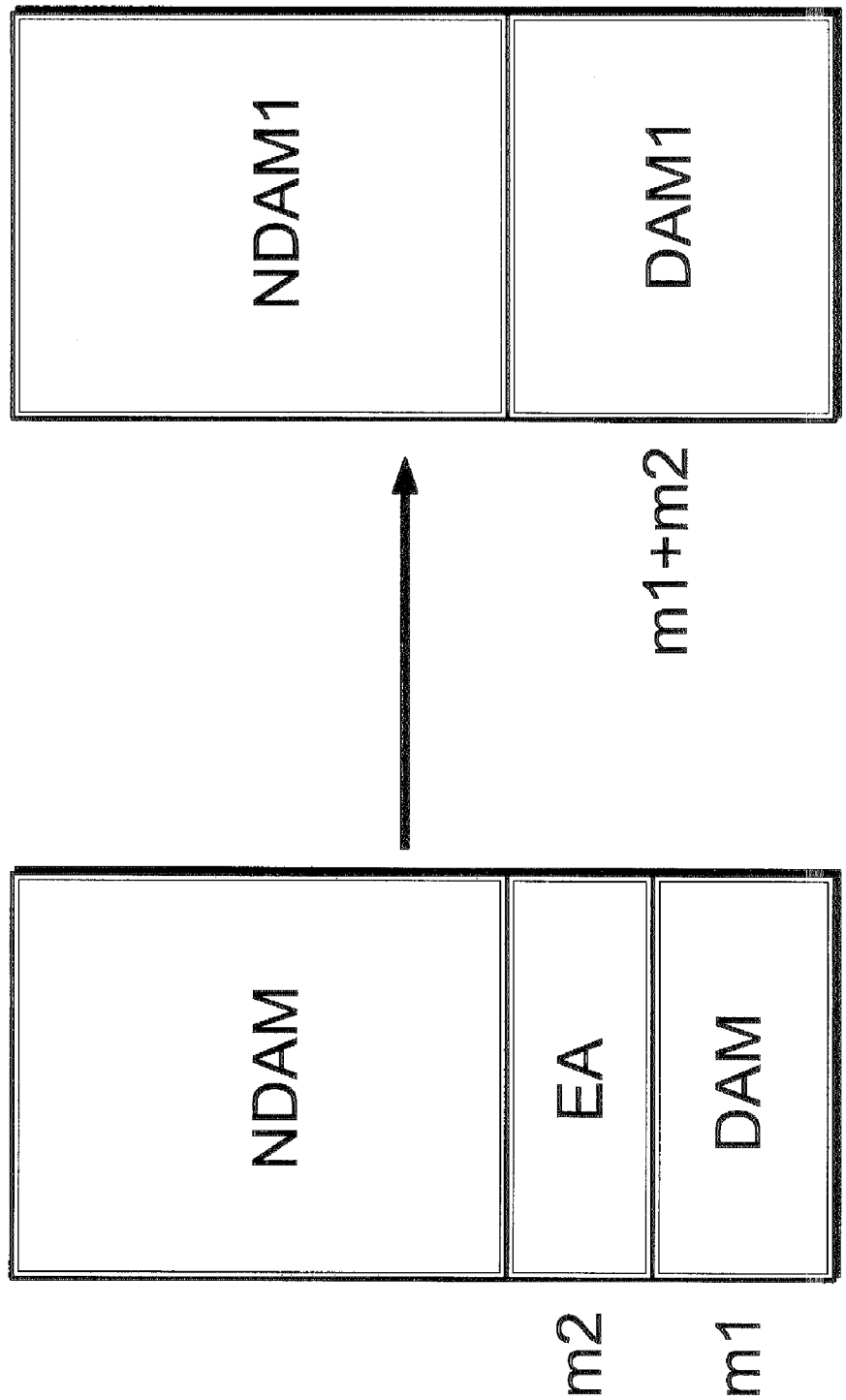
FIG. 5 schematically illustrates dynamically increasing the size of a direct access memory region (DAM) storing uncompressed data, according to an exemplary embodiment of the invention.

FIG. 5 schematically illustrates a method for increasing the size of the DAM (162) according to an exemplary embodiment of the invention. In FIG. 5, m1 denotes a current size of the DAM (162), and m2 denotes the amount of memory addresses to be added to the DAM (162) to increase the size of the DAM (162) to m1+m2. In one exemplary embodiment, this process is performed by adding m2 contiguous addresses to a DAM with size m1. In FIG. 5, the incrementally added area is denoted as EA and the increased size DAM is denoted as DAM1.

In general, the size of the DAM (162) can dynamically vary based on one or more relevant performance parameters. For instance, a performance parameter can be a DAM hit ratio, which is monitored by the system. The DAM hit ratio is a percentage of L2 misses which are served by the DAM (i.e., the requested line is found in the DAM). If the DAM hit ratio is higher than some current threshold, the size of the DAM may be decreased. If the DAM hit ratio is lower than some current threshold, then the size of the DAM may be increased.

Figure 6A:
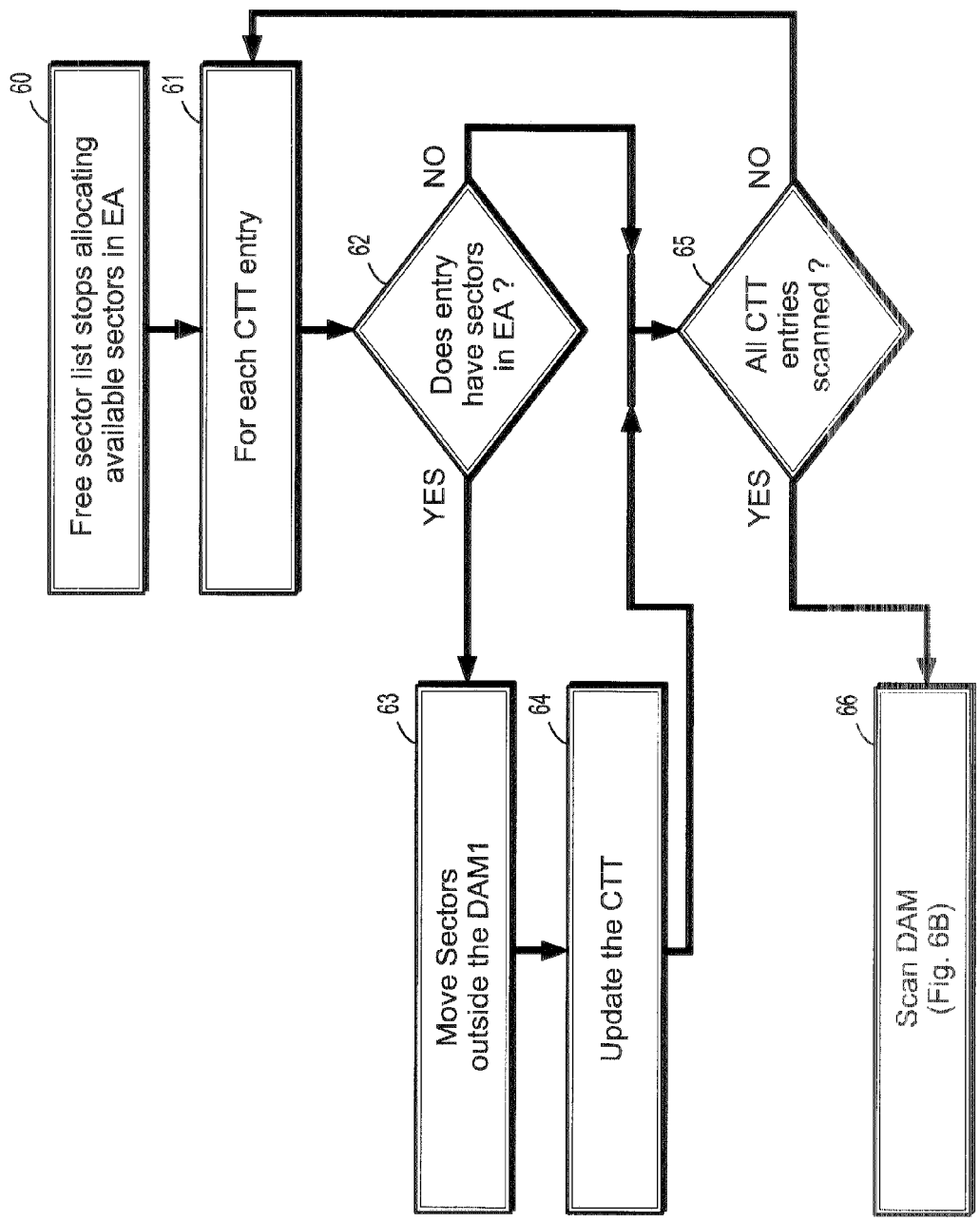
FIGS. 6A~6C illustrate a method for dynamically increasing the size of the DAM according to an exemplary embodiment of the invention.
Figure 6B:
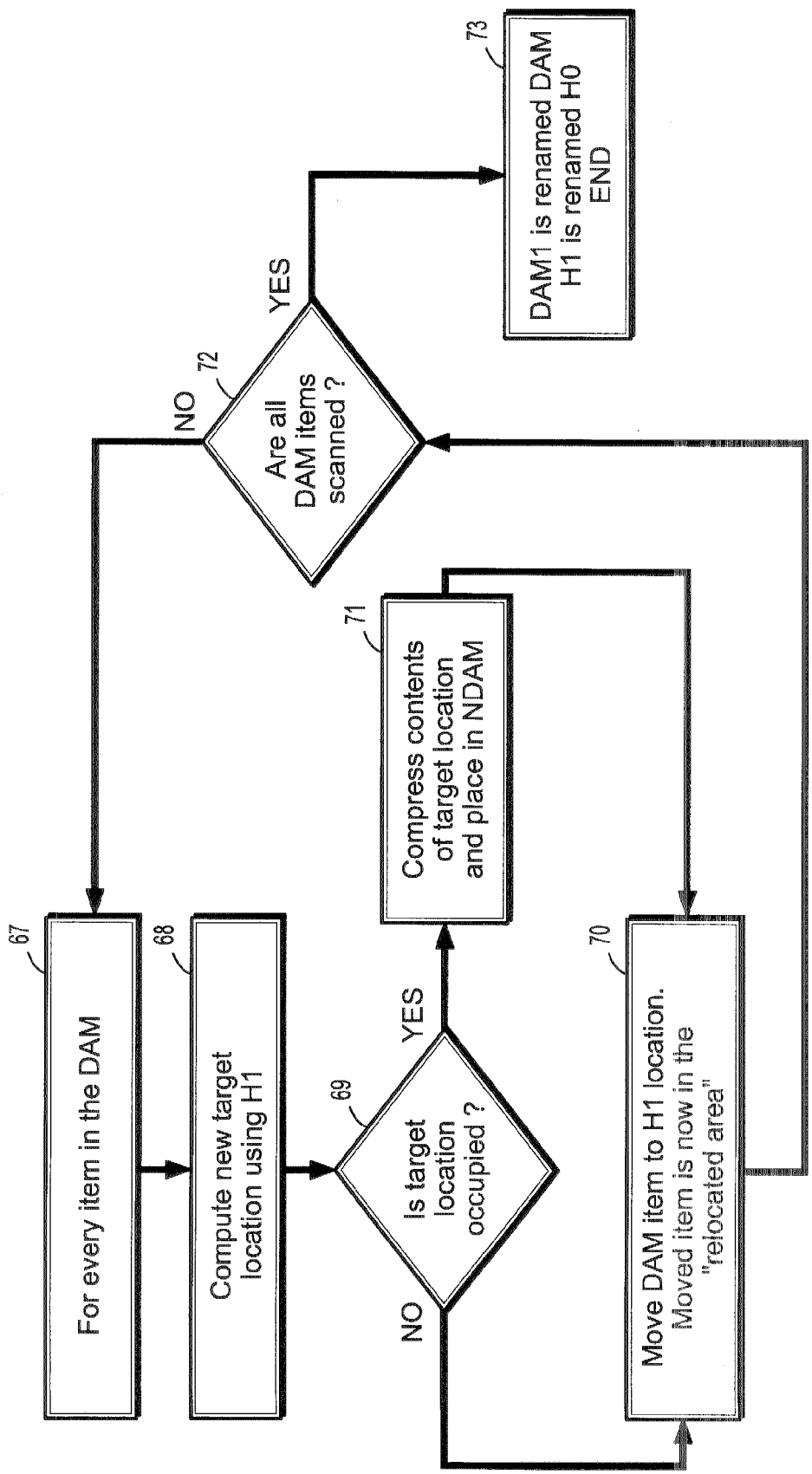
Figure 6C:
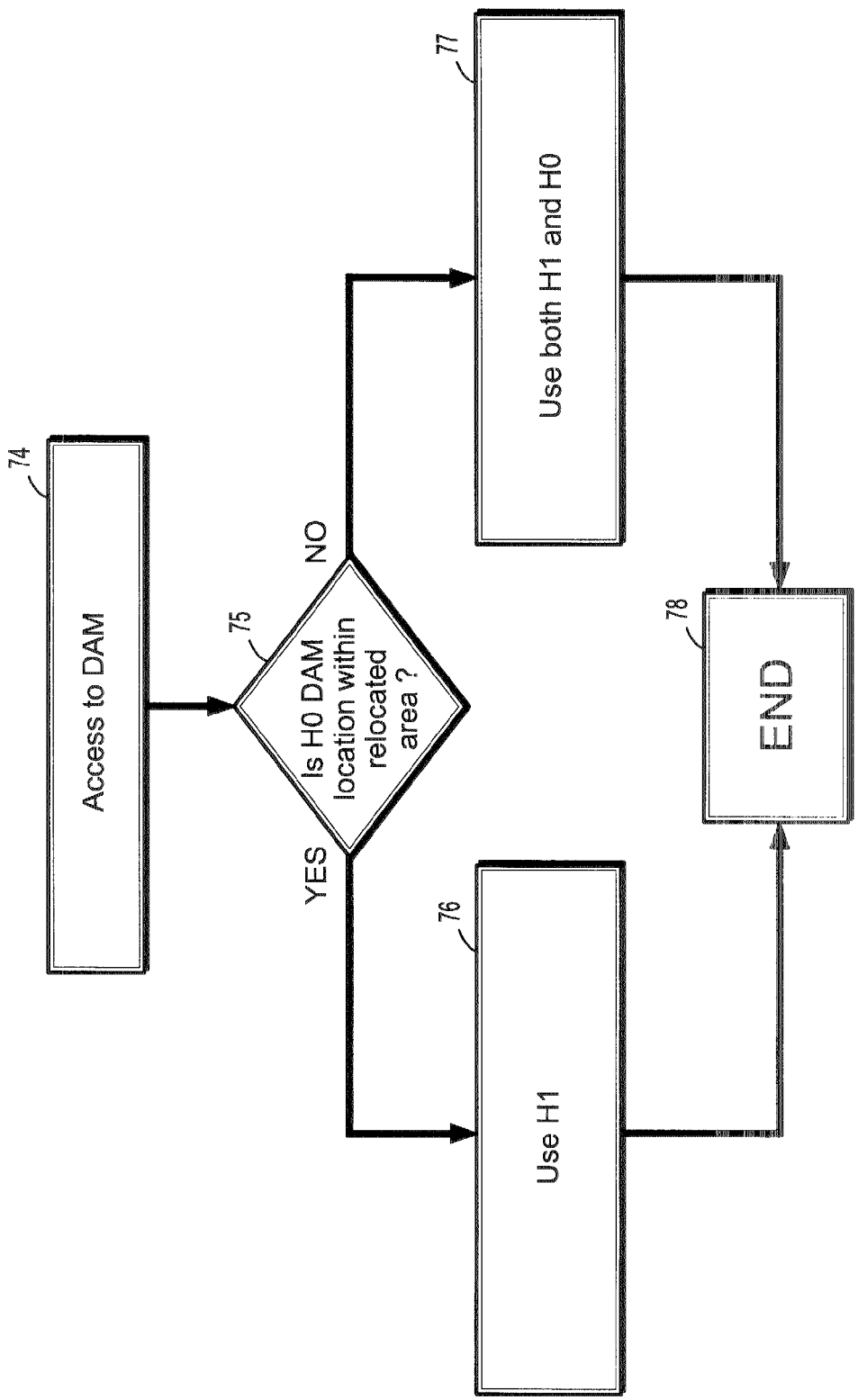

FIGS. 6A~6C illustrate a method for increasing the size of the DAM according to an exemplary embodiment of the invention. The exemplary procedure for increasing the size of the DAM will be discussed with reference to FIG. 5. Referring to FIG. 6A, the free sector list allocator stops allocating available sectors in the EA (step 60). The CTT is scanned (step 61) and for each entry, a determination is made as to whether a given entry has sectors in EA (step 62) (i.e., the CTT is scanned to identify blocks which have sectors allocated in the EA).

If a given entry is determined to have sectors in the EA (affirmative determination in step 62), the contents of those sectors are moved to new sectors in the NDAM outside the DAM1 (step 63), and the CTT is updated (step 64). This process frees the EA for use as a directly-accessed area. When all CTT entries have been scanned (affirmative result in step 65), a process is initiated to scan the DAM (66), as will now be explained with reference to FIG. 6B.

Referring to FIG. 6B, a new hash function H1 is enabled to allocate addresses throughout the DAM1. The DAM is scanned (step 67) and for each item in the DAM, the hash function H1 is used to compute a new target location to store the items (step 68) (i.e., the items are moved to locations determined by H1). A determination is made as to whether the target location is occupied by retrieving the current contents and checking the associated CTT (step 69).

If it is determined that the target location is not occupied (negative determination in step 69), the DAM item is moved to the H1 location (step 70). If, on the other hand, it is determined that the target location is occupied (affirmative determination in step (69)), the contents of the target location are compressed and stored in the NDAM and the CTT is updated (step 71). The DAM item is then moved to the H1 location (step 70). The term "relocated area" refers to the areas already scanned, plus the DAM1.

If all DAM items have not been scanned (step 72), referring to FIG. 6C, on subsequent accesses to the DAM (step 74), if the MAL using H0 is within the relocated area (affirmative determination in step 75), H1 is used (step 76). On the other hand, if the MAL for the DAM location using H0 is not within the relocated area (negative determination in step 75), then retrieval is performed using both H0 and H1 (as either may apply). Thereafter, data items that are newly stored in the DAM1 have MALs determined by H1. When the relocated area includes the entire DAM, then DAM1 is renamed the DAM, H1 is renamed H0, and operation reverts to the steady-state (step 73, FIG. 6B).

An exemplary method for decreasing the size of the DAM will now be described. For purposes of discussion, the decreased size DAM is denoted as DAM1, and the area removed is denoted EA. The hash function used is H0 and the hash function for the decreased area is denoted as H1. Initially, the EA is scanned, and data items located in the EA are recompressed and moved to the NDAM. Those areas of the EA which are already scanned are denoted the "relocated area". The new hash function H1 is enabled. Data items to be stored in the DAM are assigned MALs using H1. Data items to be retrieved from the DAM are accessed using H1 if the MAL using H0 is in the relocated area. If the MAL using H0 is outside the relocated area, the item is retrieved using both H0 and H1.

Once the EA is completely scanned, the DAM1 is scanned, and items are relocated within the DAM1 using H1. If the target location is occupied (determined by retrieving the current contents and checking the associated CTT), the contents are recompressed and stored in the NDAM and the CTT is updated. The relocated areas are those areas already scanned, plus the DAM1. On accesses to the DAM, if the MAL using H0 is within the relocated area, H1 is used. If a MAL (determined using H0) is outside the relocated area, then retrieval is performed using both H0 and H1 (as either may apply). Items newly stored in the DAA1 have MALs determined by H1. When the relocated area includes the entire DAM1, then DAM1 is renamed the DAM, H1 is renamed H0, and operation reverts to the steady-state.

In the exemplary embodiments discussed above, a data item is stored in only the NDAM (161) or the DAM (162) at a given time. In another exemplary embodiment, one or more data items may be stored in both the NDAM (161) and the DAM (162) at a given time. In this embodiment, updates to the data items in the DAM (162) would also be reflected for the corresponding data items in the NDAM (161). In this embodiment, a data item deleted from the DAM (162) would not require copying the data item into the NDAM (161).

In another exemplary embodiment of the invention, the process of replacing data items in the DAM (162) could be based on reading a bit associated with each line which indicated whether that line should be replaced, given that another line has been referenced which has the same MAL. For example, if the bit is set to 1, the line is replaced with some probability P, otherwise it is replaced with probability of 1. If the line is fetched from the DAM (162) on a reference, the line's bit is set to 1. In an exemplary embodiment where a block of 512 B is the unit of storage, the block may be replaced with probability 1 even if some lines within the block have their bits set to 1. However, these bits may still improve DAM hit ratios.

Although exemplary embodiments are described herein with reference to the exemplary compressed memory system as depicted in FIG. 1, one of ordinary skill in the art could readily envision the implementation of memory management and access operations as described herein with other compressed memory or cache system architectures in which data items in memory are stored in compressed and uncompressed form in separate regions of memory. Moreover, although the exemplary embodiments described herein assumed that every possible real address emitted by a processor had a MAL (mapping to the DAM (162) or the UC (164) regions), an alternative embodiment could be implemented where the real addresses are partitioned in two sections. The first section of the real addresses would have a MAL and the second section of the real addresses would be defined from the outset to always have data stored in the NDAM region (thus not requiring a MAL or a speculative fetch). This exemplary embodiment is of particular interest when the operative system and application have knowledge of which regions of memory are less likely to be accessed than others. Thus, in this case, the operative system and application can allocate memory for data that is accessed with less likelihood directly in the NDAM.

Accordingly, although exemplary embodiments have been described herein with reference to the accompanying drawings, it is to be understood that the present invention is not limited to those exemplary embodiments, and that various other changes and modifications may be affected therein by one of ordinary skill in the art without departing from the scope or spirit of the invention. All such changes and modifications are intended to be included within the scope of the invention as defined by the appended claims.

We claim:
1. A computer system, comprising:
a main memory having a non-direct access memory (NDAM) region and a direct-access memory (DAM) region; and
a memory controller to manage the main memory and control access to stored data items in the main memory;
wherein in response to a memory access request, the memory controller will directly access the DAM region storing ones of the data items and tags identifying the data items without use of a separate directory, speculatively, to determine if a requested data item is stored in the DAM region according to the tags, and fetch the requested data item from the DAM region to serve said memory access request if said requested data item is stored in the DAM.

2. The computer system of claim 1, wherein the DAM region stores uncompressed data.

3. The computer system of claim 1, where at least a portion of the NDAM region stores compressed data.

4. The computer system of claim 1, wherein the memory controller performs a speculative access to the DAM region using a hash function to translate a real address of the requested data item to a mapped address location (MAL) in the DAM region, and examining a respective tag identifying a stored data item at the MAL to determine if the stored data item is the requested data item.

5. The computer system of claim 1, wherein the memory controller performs a speculative access to the DAM region using a hash function to translate a real address of the requested data item to a mapped address location (MAL) in the DAM region, and comparing stored ECC (error correction code) bits associated with a stored data item at the MAL with computed ECC bits that are computed using the stored data item concatenated with a respective tag identifying the requested data item, to determine if the stored data item is the requested data item.

6. The computer system of claim 1, wherein the memory controller will fetch the requested data item from data stored in the NDAM region, if said requested data item is not stored in the DAM region.

7. The computer system of claim 1, wherein the memory controller dynamically varies the size of the DAM region in accordance with at least one memory performance parameter.

8. The computer system of claim 7, wherein the memory performance parameter is based on a percentage of memory requests that are served by access to the DAM region.

9. The computer system of claim 1, wherein a data item in the main memory is stored only in the DAM region or the NDAM region at any given time.

10. The computer system of claim 1, wherein a data item in the main memory can be stored in the DAM region and in the NDAM region at a given time.

11. The computer system of claim 1, further comprising a cache memory and a cache directory, wherein the cache directory maintains a DAM residence bit for each cached data item to indicate whether a corresponding cached data item is stored in the DAM region.

12. The computer system of claim 11, wherein the DAM residence bit in the cache directory is used during a cache eviction of a modified cached data item to determine if the modified cached data item can be directly written in the DAM region.

13. The computer system of claim 1, wherein uncompressed data items in the DAM region are concatenated with respective ones of the tags which provide information related to frequency of access to the data items, which is used to determine a desired compression status of said data items.

14. The computer system of claim 1, wherein compressed data items in the NDAM region are concatenated with respective ones of the tags which provide information used to determine a desired compression status of the compressed data items.

15. A method for managing a compressed memory system, comprising:
allocating memory in a main memory to contain a non-direct access memory (NDAM) region and a direct access memory (DAM) region;
processing an access request to the main memory for a requested data item by first directly accessing the DAM region storing data items and tags identifying the data items without use of a separate directory, speculatively, to determine if the requested data item is stored in the DAM region; and
fetching the requested data item from the DAM region to serve said access request, if said requested data item is stored in the DAM.

16. The method of claim 15, where the DAM region stores uncompressed data.

17. The method of claim 15, wherein at least a portion of the NDAM region stores compressed data.

18. The method of claim 15, wherein processing the access request comprises:
performing a speculative access to the DAM region using a hash function to translate a real address of the requested data item to a mapped address location (MAL) in the DAM region; and
examining tag data associated with an uncompressed data item stored at the MAL to determine if the uncompressed data item is the requested data item.

19. The method of claim 15, wherein processing the access request comprises:
performing a speculative access to the DAM region using a hash function to translate a real address of the requested data item to a mapped address location (MAL) in the DAM region;
computing ECC (error correction code) bits for a data word that is generated by concatenating a stored data item at the MAL with a respective tag of the requested data item; and
comparing stored ECC bits for the stored data item at the MAL with the computed ECC bits to determine if the stored data item is the requested data item.

20. The method of claim 15, further comprising fetching the requested data item from the NDAM memory region, if the requested data item is not stored in the DAM region at the MAL of the real address of the requested data line.

21. The method of claim 15, further comprising dynamically changing a size of the DAM region in accordance with at least one memory performance parameter.

22. The method of claim 21, further comprising monitoring a memory performance parameter based on a percentage of cache misses that are served by speculative access to the DAM region, and increasing or decreasing a size of the DAM region based on a threshold memory performance parameters.

23. The method of claim 15, wherein a data item in the main memory is stored only in the NDAM region or the NDAM at any given time.

24. The method of claim 15, wherein a data item in the main memory can be stored in both the NDAM region and the DAM region at any given time.

25. The method of claim 15, further comprising maintaining a cache directory for uncompressed data items stored in a cache memory, wherein the cache directory maintains a DAM residence bit for a cached data item to indicate whether the cached data item is stored in the DAM region.

26. The method of claim 25, wherein the DAM residence bit in the cache directory for a given cached data item is used during a cache eviction of a modified cached data item to determine if the modified cached data can be directly written in the DAM region.

27. The method of claim 15, further comprising maintaining tags associated with data items in the DAM region, wherein the tags provide information related to a frequency of access to the data items in the DAM region, which is used to determine a desired compression status of the data items.

28. The method of claim 15, further comprising maintaining tag bits associated with compressed data items in the compressed memory region, which provide information used to determine a desired compression status of the compressed data items.

* * * * *